United States Patent
Saito et al.

(10) Patent No.: US 11,807,652 B2
(45) Date of Patent: Nov. 7, 2023

(54) TUNGSTEN COMPOUND, RAW MATERIAL FOR THIN FILM FORMATION AND METHOD FOR PRODUCING THIN FILM

(71) Applicant: ADEKA CORPORATION, Tokyo (JP)

(72) Inventors: Akio Saito, Tokyo (JP); Tsubasa Shiratori, Tokyo (JP); Yutaro Aoki, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 452 days.

(21) Appl. No.: 16/631,245

(22) PCT Filed: Jul. 4, 2018

(86) PCT No.: PCT/JP2018/025392
§ 371 (c)(1),
(2) Date: Jan. 15, 2020

(87) PCT Pub. No.: WO2019/039103
PCT Pub. Date: Feb. 28, 2019

(65) Prior Publication Data
US 2020/0216479 A1    Jul. 9, 2020

(30) Foreign Application Priority Data

Aug. 21, 2017  (JP) .................................. 2017-158565

(51) Int. Cl.
*C07F 11/00* (2006.01)
*C23C 16/40* (2006.01)
(Continued)

(52) U.S. Cl.
CPC ............ *C07F 11/00* (2013.01); *C23C 16/405* (2013.01); *C23C 16/45553* (2013.01);
(Continued)

(58) Field of Classification Search
None
See application file for complete search history.

(56) References Cited

U.S. PATENT DOCUMENTS

2018/0208617 A1 * 7/2018 Lee .......................... C07F 11/00

FOREIGN PATENT DOCUMENTS

| JP | 2014-534952 | 12/2014 |
| JP | 2015-221940 | 12/2015 |

(Continued)

OTHER PUBLICATIONS

Sundermeyer, J. Chemische Berichte (1991), 124(9), 1977-9.*
(Continued)

*Primary Examiner* — Alexander R Pagano
(74) *Attorney, Agent, or Firm* — Wenderoth, Lind & Ponack, L.L.P.

(57) ABSTRACT

The present invention provides a tungsten compound represented by the following general formula (1):

[Chemical Formula 1]

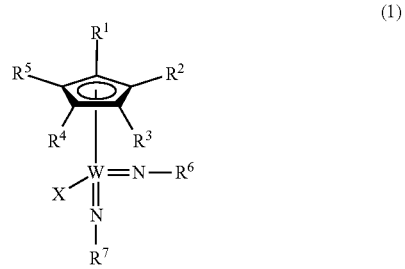

(1)

(in the formula, X represents a halogen atom, $R^1$ to $R^5$ each independently represent a hydrogen atom or an alkyl group having 1 to 5 carbon atoms, $R^6$ represents a tertiary butyl group or a tertiary pentyl group, and $R^7$ represents an alkyl group having 1 to 5 carbon atoms. However, when $R^1$ to $R^5$ are all hydrogen atoms and $R^6$ is a tertiary butyl group, and when $R^1$ to $R^5$ are all methyl groups and $R^6$ is a tertiary butyl group, $R^7$ represents an alkyl group having 1 to 3 or 5 carbon atoms).

2 Claims, 4 Drawing Sheets

(51) Int. Cl.
*C23C 16/455* (2006.01)
*H01L 21/02* (2006.01)

(52) U.S. Cl.
CPC .... *H01L 21/0228* (2013.01); *H01L 21/02175* (2013.01); *H01L 21/02205* (2013.01)

(56) References Cited

FOREIGN PATENT DOCUMENTS

| WO | 2017/014399 | | 1/2017 | |
|----|----|----|----|----|
| WO | WO2017014399 | * | 1/2017 | .............. C07F 11/00 |
| WO | WO-2017014399 A1 | * | 1/2017 | .............. C07F 17/00 |

OTHER PUBLICATIONS

Derwent abstract of Chemische Berichte (1991), 124(9), 1977-9.*
WO2017014399 machine translation from Google Patents downloaded Aug. 13, 2022.*
Sundemeyer, J. Chemische Berichte (1991), 124(9), 1977-9.*
U. Radius et al., 125 Chemische Berichte, 2183-2186 (1992) (Year: 1992).*
U. Radius et al., 125 Chemische Berichte, 2379-2384 (1992) (Year: 1992).*
J. Sundermeyer et al., 33 Angew. Chem., Int. Ed. Engl., 1255-1257 (1994) (Year: 1994).*
U. Radius et al., European Journal of Inorganic Chemistry, 1617-1623 (2001) (Year: 2001).*
U. Radius et al., 655 Journal of Organometallic Chemistry, 96-104 (2002) (Year: 2002).*
International Search Report dated Oct. 2, 2018 in International (PCT) Application No. PCT/JP2018/025392.

* cited by examiner

[Fig. 1]
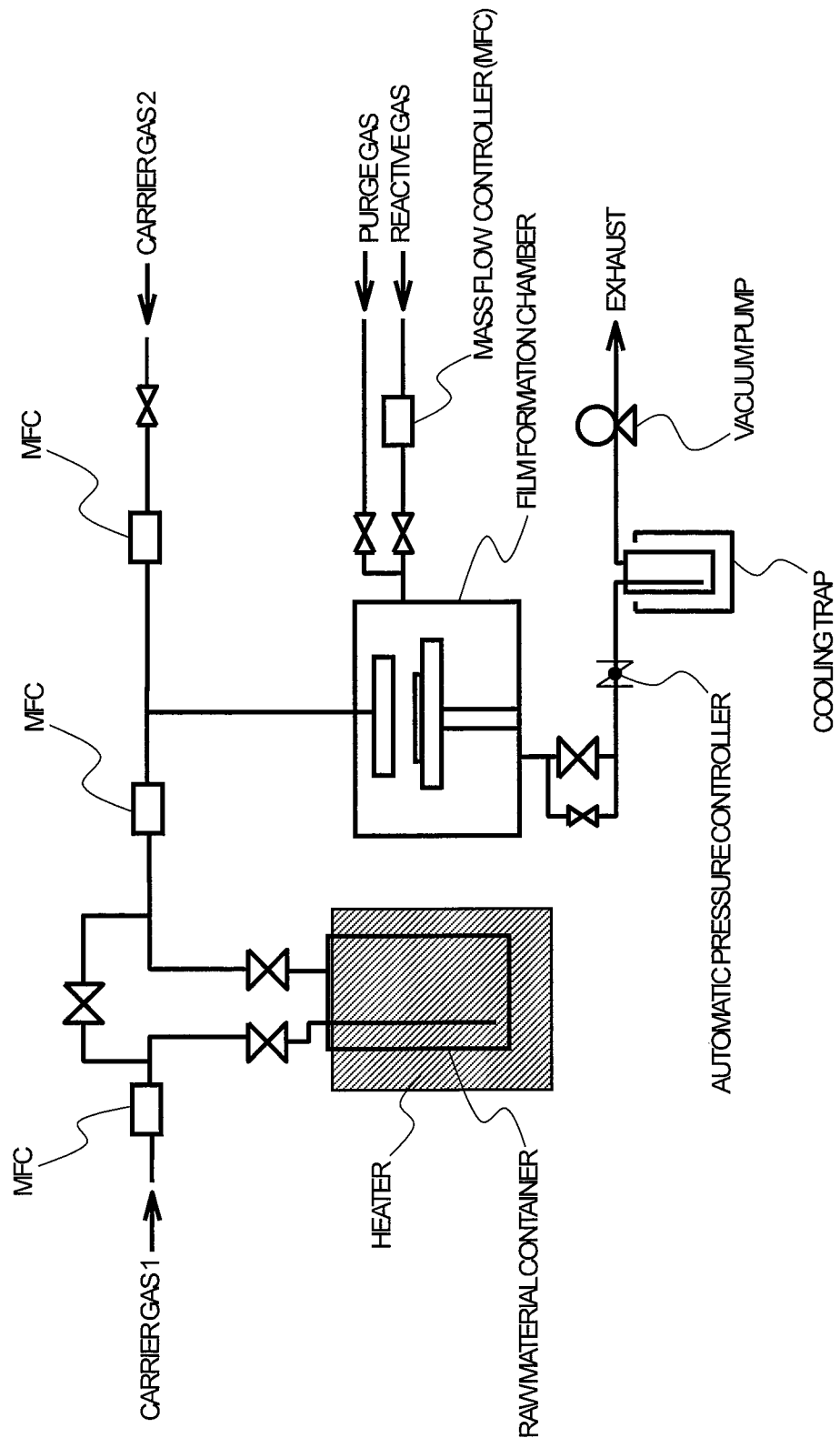

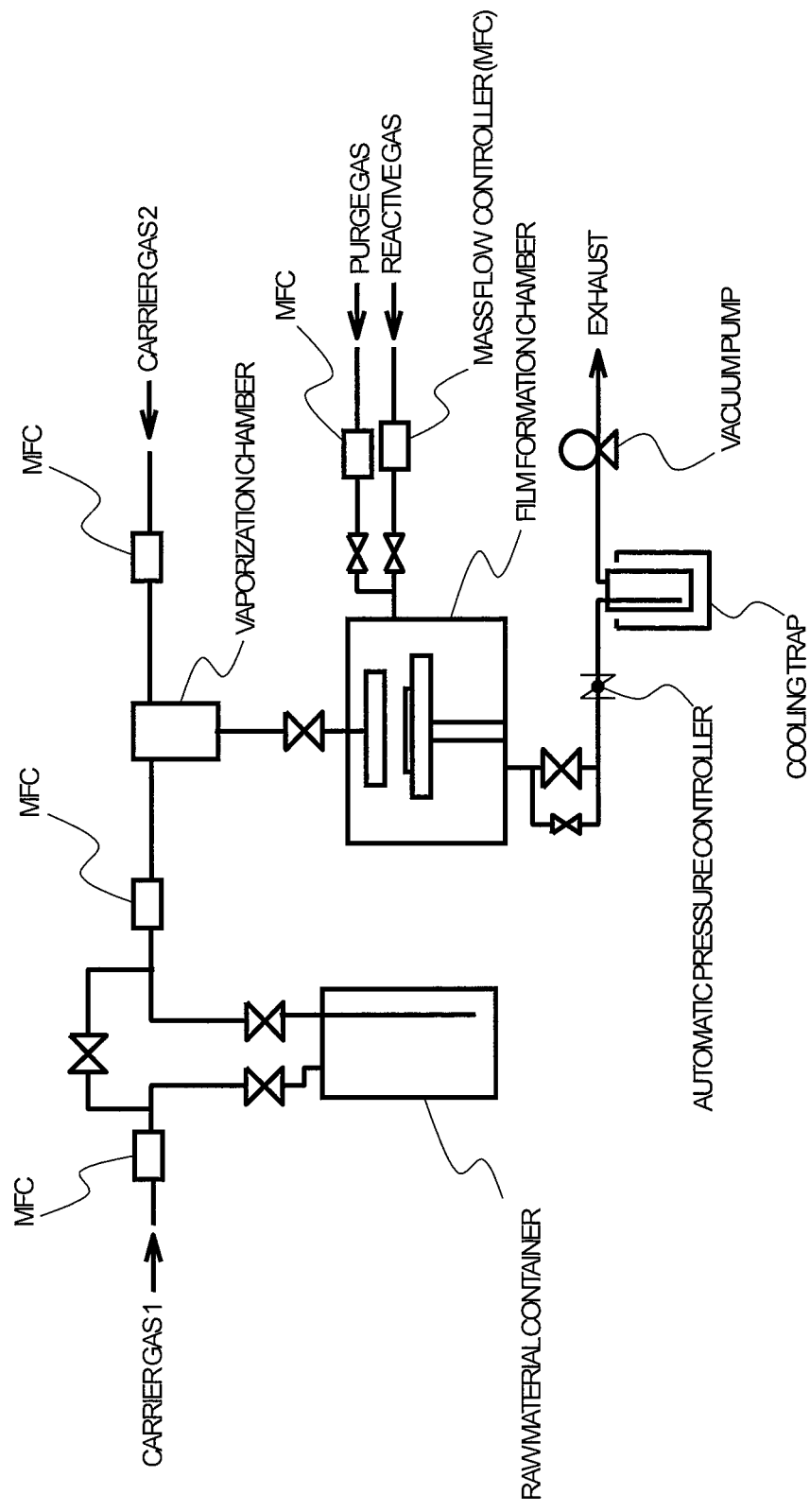
[Fig. 2]

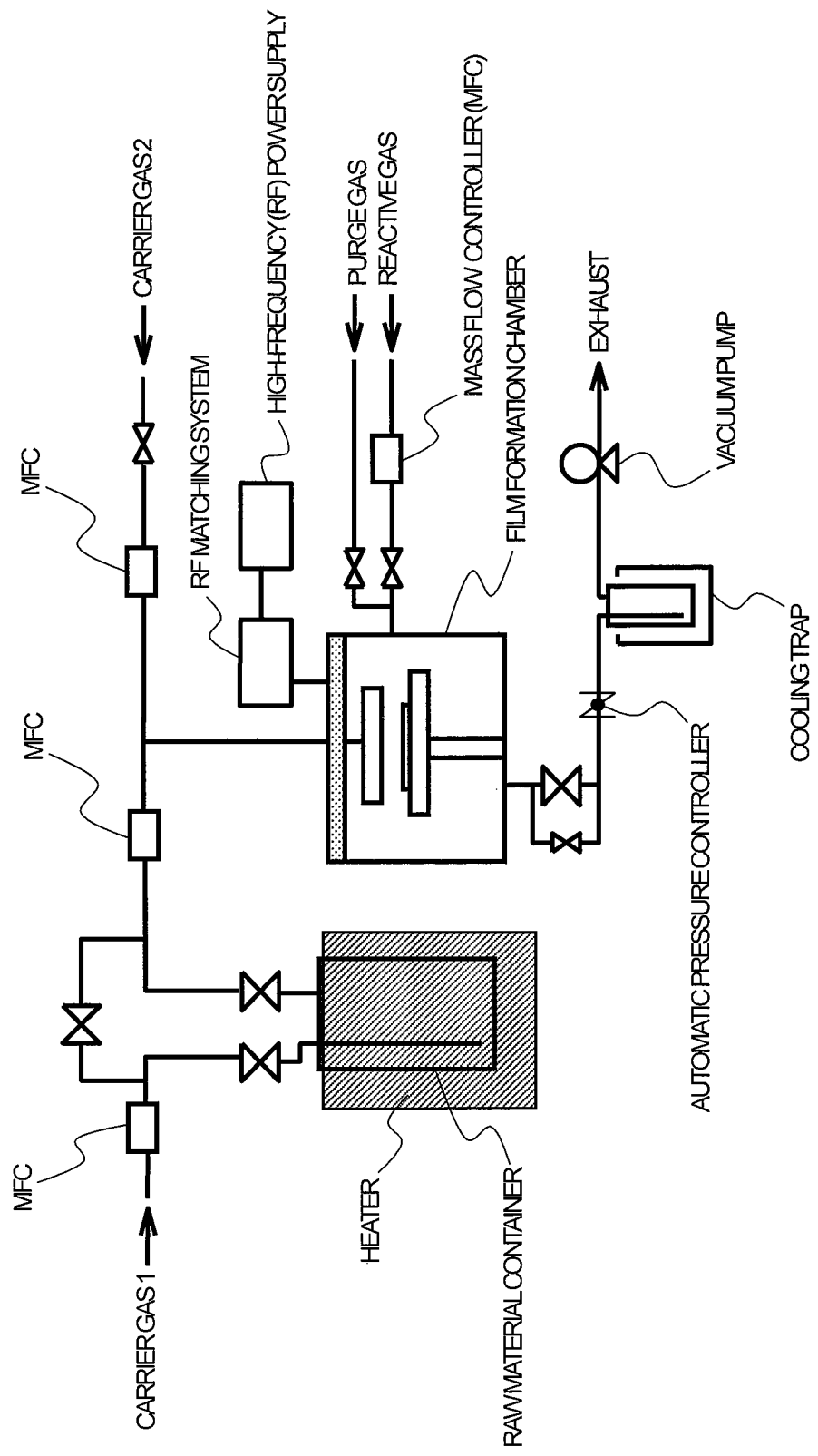
[Fig. 3]

[Fig. 4]
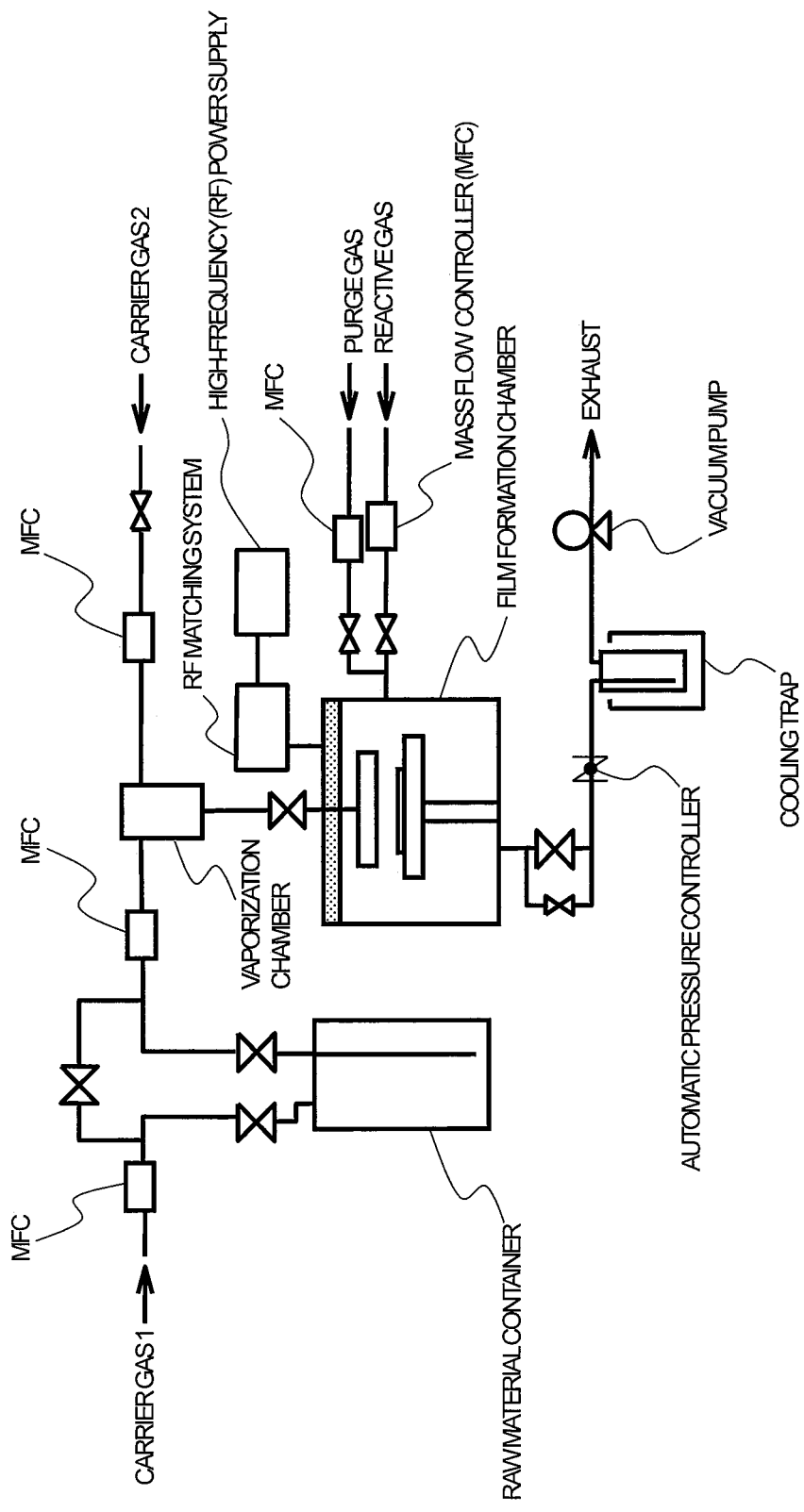

TUNGSTEN COMPOUND, RAW MATERIAL FOR THIN FILM FORMATION AND METHOD FOR PRODUCING THIN FILM

TECHNICAL FIELD

The present invention relates to a novel tungsten compound, a raw material for forming a thin film containing the compound, and a method for producing a thin film using the raw material for thin film formation.

BACKGROUND ART

A tungsten-containing thin film is used for a MOSFET gate electrode, a source/drain contact, a memory word line, and the like used when an LSI is produced.

Examples of a method for producing a thin film include a sputtering method, an ion plating method, an MOD method such as a coating pyrolysis method and a sol-gel method, and a chemical vapor deposition method. However, a chemical vapor deposition (hereinafter simply referred to as "CVD") method including an atomic layer deposition (ALD) method is an optimal production process because it has many advantages such as excellent composition controllability and step coverage, being suitable for mass production, and enabling hybrid integration.

A large number of various raw materials are reported as tungsten atom supply sources used for chemical vapor deposition. For example, in Paten Document 1, regarding a tungsten atom supply source that can be used as a raw material for thin film formation according to a CVD method, tungsten chloride such as $WCl_2$, $WCl_4$, $WCl_5$, and $WCl_6$ and mixtures thereof is disclosed. In addition, in Patent Document 2, regarding a tungsten atom supply source used for a CVD method and an ALD method, a compound represented by formula W $(R_1\text{—}N\text{=}CR_3\text{—}CR_4\text{=}N\text{—}R_2)_3$ (in the formula, $R_1$, $R_2$, $R_3$ and $R_4$ are each independently selected from among H; a $C_1$ to $C_6$ linear, branched or cyclic alkyl group; a $C_1$ to $C_6$ linear, branched or cyclic alkylsilyl group; a $C_1$ to $C_6$ linear, branched or cyclic alkylamino group; and a $C_1$ to $C_6$ linear, branched or cyclic fluoroalkyl group) including a tungsten diazabutadiene compound is disclosed. However, Patent Documents 1 and 2 do not specifically describe a tungsten compound of the present invention.

PRIOR ART DOCUMENTS

Patent Documents

[Patent Document 1] Japanese Patent Laid-Open No. 2015-221940
[Patent Document 2] Japanese Patent Laid-Open No. 2014-534952

SUMMARY OF THE INVENTION

Problems to be Solved by the Invention

Properties required for a compound (precursor) used in a method in which a compound is vaporized according to a CVD method or the like and a thin film is formed, which is not limited to a tungsten compound, include a low melting point, being transportable in a liquid state, a high vapor pressure, and being easily vaporized. In addition, in the formed thin film, in order to produce a high quality tungsten-containing film having a low concentration of undesirable foreign substances such as carbon residue, a tungsten compound that can be applied to an ALD method is required. However, conventional tungsten compounds have not been fully satisfactory in terms of such properties.

Therefore, an object of the present invention is to obtain a novel tungsten compound which can be used as a raw material for thin film formation according to a CVD method, and has a high vapor pressure and can become a liquid at room temperature or according to slight heating.

Means for Solving the Problem

As a result of repeated examinations, the inventors found that a specific tungsten compound can address the above problem and thus developed the present invention.

That is, the present invention provides a tungsten compound represented by the following general formula (1):

[Chemical Formula 1]

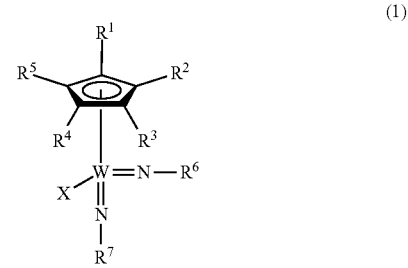

(in the formula, X represents a halogen atom, $R^1$ to $R^5$ each independently represent a hydrogen atom or an alkyl group having 1 to 5 carbon atoms, $R^6$ represents a tertiary (tert-) butyl group or a tert-pentyl group, and $R^7$ represents an alkyl group having 1 to 5 carbon atoms. However, when $R^1$ to $R^5$ are all hydrogen atoms and $R^6$ is a tert-butyl group, and when $R^1$ to $R^5$ are all methyl groups and $R^6$ is a tert-butyl group, $R^7$ represents an alkyl group having 1 to 3 or 5 carbon atoms).

In addition, the present invention provides a raw material for forming a thin film including the tungsten compound represented by general formula (1).

In addition, the present invention provides a method for producing a thin film including introducing vapor containing a tungsten compound represented by general formula (1) obtainable by vaporizing the raw material for thin film formation into a film-forming chamber in which a substrate is set, and decomposing and/or chemically reacting the tungsten compound to form a tungsten atom-containing thin film on a surface of the substrate.

Effects of the Invention

According to the present invention, it is possible to obtain a novel tungsten compound which has a vapor pressure and can become a liquid at room temperature or according to slight heating. When this tungsten compound is used as a raw material for thin film formation according to a CVD method, transportability of a precursor is excellent, control of an amount thereof supplied to a substrate is easy, and stable supply is possible in a process of producing a tungsten-containing thin film according to the CVD method. Therefore, it is possible to produce a high quality tungsten-containing thin film with high productivity. In addition, since the tungsten compound can be applied to an ALD method, it is particularly suitable as a raw material for thin film formation for an ALD method.

BRIEF DESCRIPTION OF DRAWINGS

FIG. 1 is a schematic view showing an example of a chemical vapor deposition device used in a method for producing a thin film according to the present invention.

FIG. 2 is a schematic view showing another example of the chemical vapor deposition device used in a method for producing a thin film according to the present invention.

FIG. 3 is a schematic view showing still another example of the chemical vapor deposition device used in a method for producing a thin film according to the present invention.

FIG. 4 is a schematic view showing still another example of the chemical vapor deposition device used in a method for producing a thin film according to the present invention.

BEST MODE FOR CARRYING OUT THE INVENTION

A tungsten compound of the present invention is represented by general formula (1) and is suitable as a precursor in a method for producing a thin film including a vaporization process such as a CVD method, and can be used to form a thin film using an ALD method.

In general formula (1), X represents a halogen atom. Examples of halogen atoms include a chlorine atom, a fluorine atom, and a bromine atom. Among these, a chlorine atom is preferable.

In general formula (1), $R^1$ to $R^5$ each independently represent a hydrogen atom or an alkyl group having 1 to 5 carbon atoms, $R^6$ represents a tert-butyl group or a tert-pentyl group, and $R^7$ represents an alkyl group having 1 to 5 carbon atoms.

Examples of an alkyl group having 1 to 5 carbon atoms include a methyl group, an ethyl group, a propyl group, an n-propyl group, an isopropyl group, an n-butyl group, an isobutyl group, a sec-butyl group, a tert-butyl group, an n-pentyl group, an isopentyl group, a sec-pentyl group and a tert-pentyl group.

In general formula (1), when $R^1$ to $R^5$ are all hydrogen atoms and $R^6$ is a tert-butyl group, and when $R^1$ to $R^5$ are all methyl groups and $R^6$ is a tert-butyl group, $R^7$ represents an alkyl group having 1 to 3 or 5 carbon atoms.

Examples of an alkyl group having 1 to 3 or 5 carbon atoms include a methyl group, an ethyl group, an n-propyl group, an isopropyl group, an n-pentyl group, an isopentyl group, a sec-pentyl group and a tert-pentyl group.

In general formula (1), it is preferable that $R^1$ be a methyl group, an ethyl group or an isopropyl group, and $R^2$ to $R^5$ be all a hydrogen atom because it is possible to produce a high quality thin film with high productivity when a thin film is produced using a raw material for thin film formation of the present invention which has a high vapor pressure and a low melting point. Among these, it is preferable that $R^1$ be an isopropyl group because such effects are stronger, and it is more preferable that $R^1$ be an isopropyl group and X be a chlorine atom because such effects are significantly stronger.

In addition, in general formula (1), it is preferable that $R^1$ to $R^5$ all be the same or they all be hydrogen atoms or linear or branched alkyl groups having 1 to 3 carbon atoms because such effects are strong.

Specific examples of a preferable tungsten compound represented by general formula (1) include compounds represented by the following Chemical formulae No. 1 to No. 44. Here, in the following Chemical formulae No. 1 to No. 44, "Me" represents a methyl group, "Et" represents an ethyl group, "nPr" represents an n-propyl group, "iPr" represents an isopropyl group, "nBu" represents an n-butyl group, and "tBu" represents a tert-butyl group.

[Chemical Formula 2]

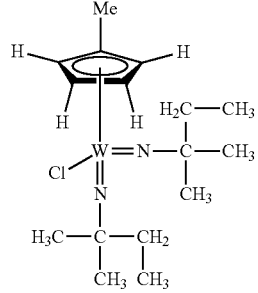

Compound No.1

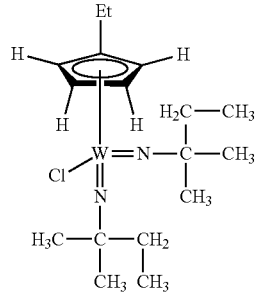

Compound No.2

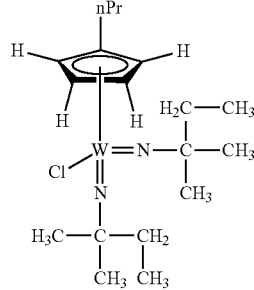

Compound No.3

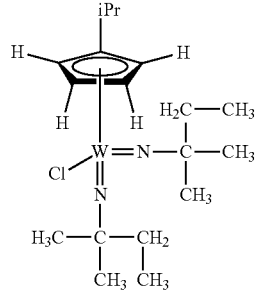

Compound No.4

-continued
Compound No.5
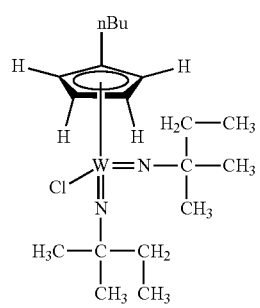
Compound No.6
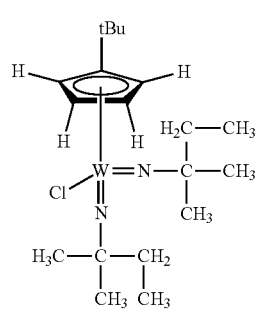
Compound No.7
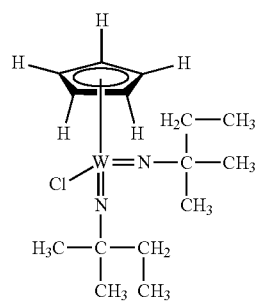
Compound No.8
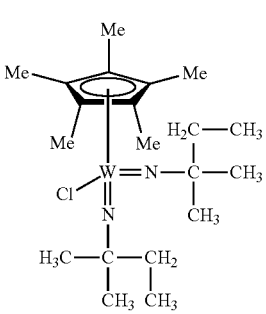
[Chemical Formula 3]
Compound No.9
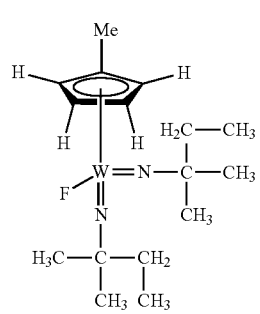
-continued
Compound No.10
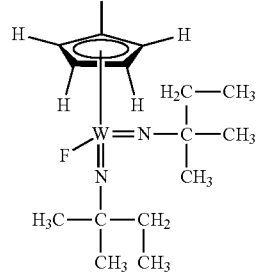
Compound No.11
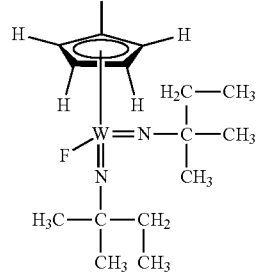
Compound No.12
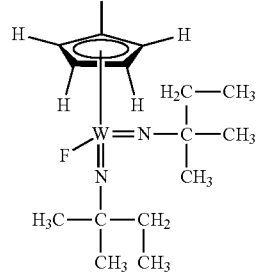
Compound No.13
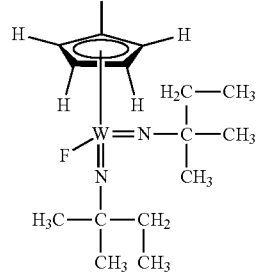
Compound No.14
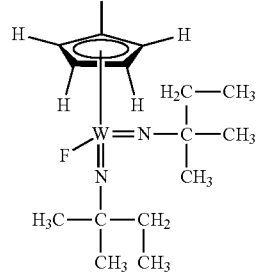

Compound No.15
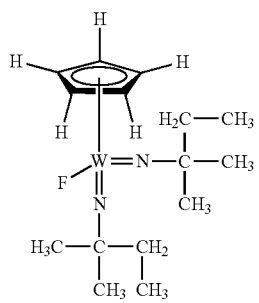
Compound No.16
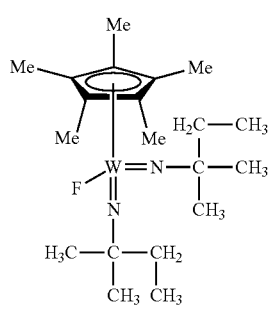
[Chemical Formula 4]
Compound No.17
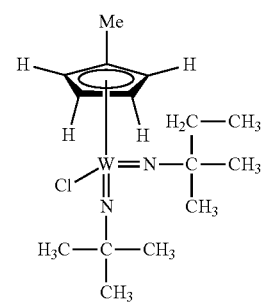
Compound No.18
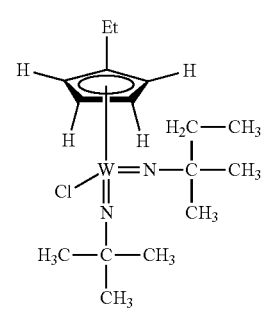
Compound No.19
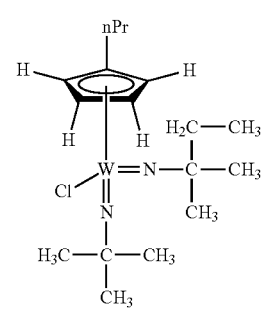
Compound No.20
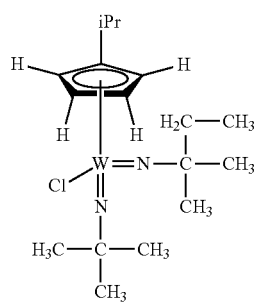
Compound No.21
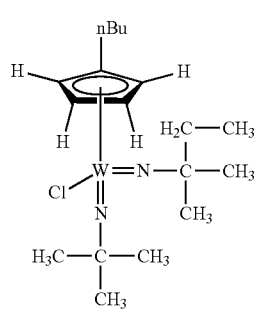
Compound No.22
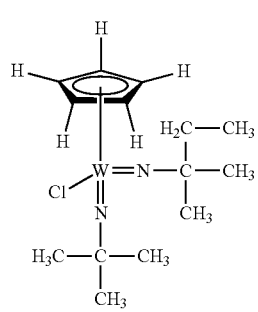
Compound No.23
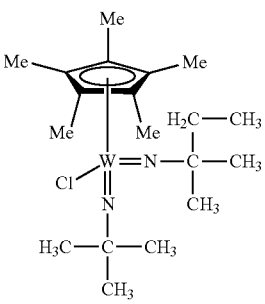
Compound No.24

[Chemical Formula 5]
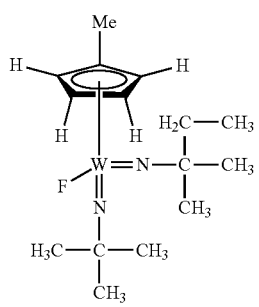
Compound No.25
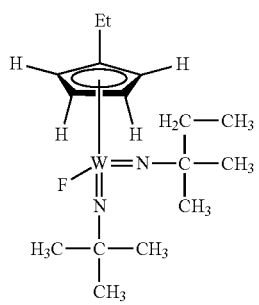
Compound No.26
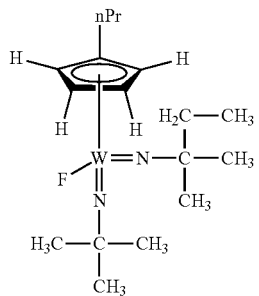
Compound No.27
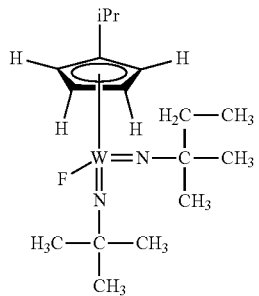
Compound No.28
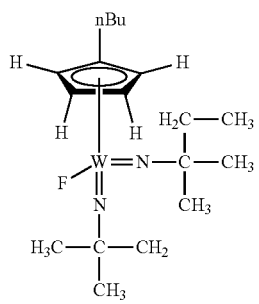
Compound No.29
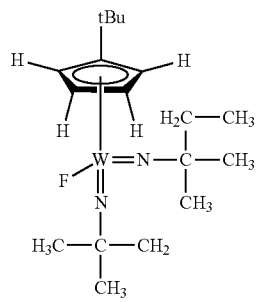
Compound No.30
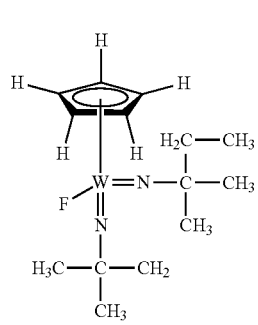
Compound No.31
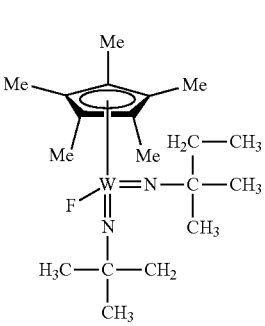
Compound No.32
[Chemical Formula 6]
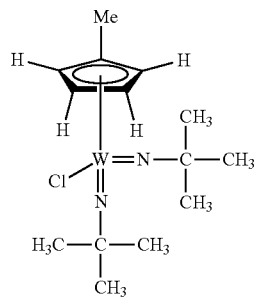
Compound No.33
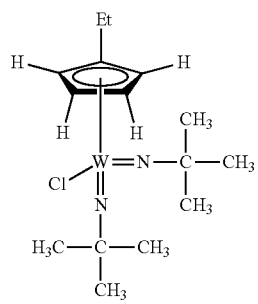
Compound No.34

-continued

Compound No.35

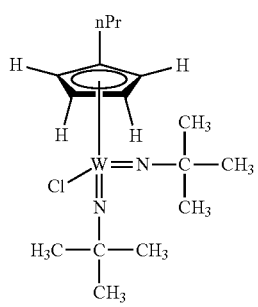

Compound No.36

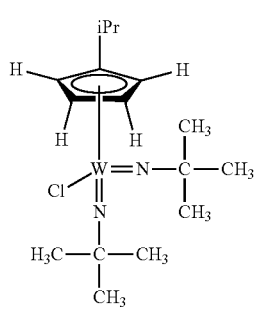

Compound No.37

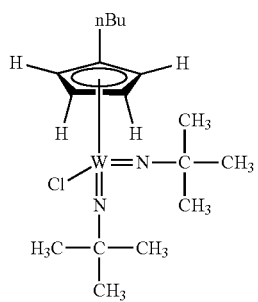

Compound No.38

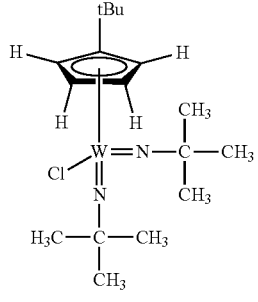

[Chemical Formula 7]

Compound No.39

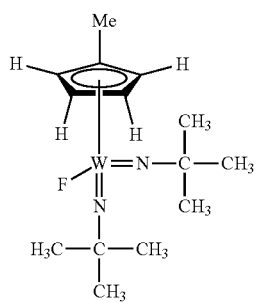

-continued

Compound No.40

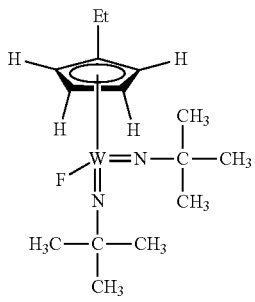

Compound No.41

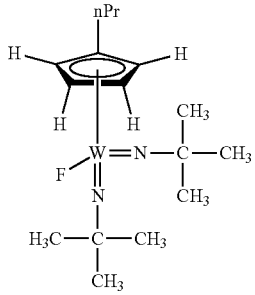

Compound No.42

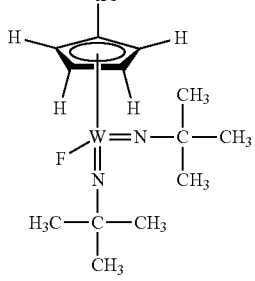

Compound No.43

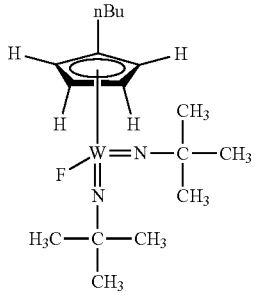

Compound No.44

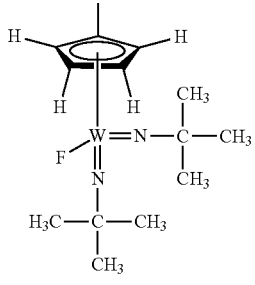

The tungsten compound of the present invention is not particularly limited by the production method, and can be produced by applying a well-known reaction. For example, when tungsten chloride is used as a raw material, methods exemplified in the following formulae 2 and 3 can be used. Here, in formulae 2 and 3, "tAm" represents a tert-pentyl group.

[Chemical Formula 8]

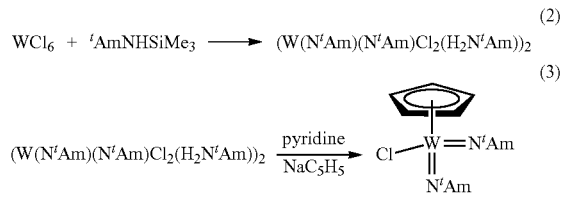

Regarding another method for producing a tungsten compound of the present invention, when monocyclopentadienyltricarbonylmonohydrotungsten is used as a raw material, methods shown in the following formulae 4 and 5 can be used. Regarding monocyclopentadienyltricarbonylmonohydrotungsten in the following formulae 4 and 5, monoalkylcyclopentadienyltricarbonylmonohydrotungsten may be used.

[Chemical Formula 9]

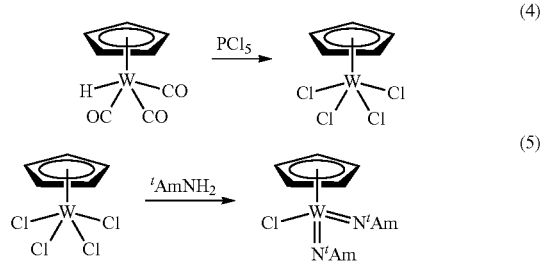

In the raw material for thin film formation of the present invention, the tungsten compound of the present invention described above is used as a precursor of a thin film, and its form differs depending on a production process in which the raw material for thin film formation is applied. For example, when a thin film containing only tungsten as a metal atom is produced, the raw material for thin film formation of the present invention does not contain a metal compound other than the tungsten compound and a semi-metal compound. On the other hand, when a thin film containing two or more types of metals and/or semi-metals including tungsten as metal atoms is produced, the raw material for thin film formation of the present invention contains a compound containing a desired metal and/or a compound containing a semi-metal (hereinafter referred to as other precursors) in addition to the tungsten compound. As will be described below, the raw material for thin film formation of the present invention may further contain an organic solvent and/or a nucleophilic reagent. The raw material for thin film formation of the present invention is particularly useful as a raw material for chemical vapor deposition (hereinafter referred to as a "raw material for CVD") because, as described above, physical properties of a tungsten compound as a precursor are suitable for the CVD method and the ALD method.

When the raw material for thin film formation of the present invention is a raw material for chemical vapor deposition, its form is appropriately selected according to a method such as a transport supply method in the CVD method used or the like.

Regarding the transport supply method, a gas transport method in which a raw material for CVD is vaporized into vapor by being heated and/or depressurized in a container in which the raw material is stored (hereinafter simply referred to as a "raw material container"), and as necessary, together with a carrier gas such as argon, nitrogen, and helium used, the vapor is introduced into a film-forming chamber in which a substrate is set (hereinafter referred to as a "deposition reaction unit") and a liquid transport method in which a raw material for CVD in a liquid or solution state is transported to a vaporization chamber and is vaporized into vapor by being heated and/or depressurized in the vaporization chamber, and the vapor is introduced into a film-forming chamber may be exemplified. In the case of the gas transport method, the tungsten compound represented by general formula (1) can be directly used as a raw material for CVD. In the case of the liquid transport method, the tungsten compound represented by general formula (1) itself or a solution in which the compound is dissolved in an organic solvent can be used as a raw material for CVD. Such a raw material for CVD may further contain other precursors, a nucleophilic reagent, and the like.

In addition, in the multi-component CVD method, a method in which components in a raw material for CVD are independently vaporized and supplied (hereinafter referred to as a single source method), and a method in which a mixed raw material in which multi-component raw materials are mixed in a desired composition in advance is vaporized and supplied (hereinafter referred to as a "cocktail source method") are used. In the case of the cocktail source method, a mixture containing the tungsten compound of the present invention and other precursors or a mixed solution in which the mixture is dissolved in an organic solvent can be used as a raw material for CVD. The mixture or mixed solution may further contain a nucleophilic reagent and the like.

Regarding the organic solvent, a well-known and generally used organic solvent can be used without any particular limitation. Examples of organic solvents include acetate esters such as ethyl acetate, butyl acetate, and methoxyethyl acetate; ethers such as tetrahydrofuran, tetrahydropyran, ethylene glycol dimethyl ether, diethylene glycol dimethyl ether, triethylene glycol dimethyl ether, dibutyl ether, and dioxane; ketones such as methyl butyl ketone, methyl isobutyl ketone, ethyl butyl ketone, dipropyl ketone, diisobutyl ketone, methyl amyl ketone, cyclohexanone, and methyl cyclohexanone; hydrocarbons such as hexane, cyclohexane, methylcyclohexane, dimethylcyclohexane, ethylcyclohexane, heptane, octane, toluene, and xylene; hydrocarbons having a cyano group such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; pyridine; and lutidine. These may be used alone or as a solvent in which two or more thereof are mixed depending on the solubility of a solute, the relationship between an operation temperature, a boiling point, and a flash point, and the like. When such an organic solvent is used, preferably, a total amount of the precursors in a raw material for CVD, which is a solution in which the precursors are dissolved in the organic solvent, is 0.01 to 2.0 mol/liter, and particularly 0.05 to 1.0 mol/liter. When the raw material for thin film formation of the present invention does not contain a metal compound other than the tungsten compound of the present invention and a semi-metal compound, the total amount of the precursors is an amount of the tungsten compound of the present invention, and when the raw material for thin film formation of the present invention contains a compound containing another metal in addition to the tungsten compound and/or a compound containing a semi-metal, the total amount of the precursors is the total amount of the tungsten compound of the present invention and other precursors.

In addition, in the case of the multi-component CVD method, regarding other precursors to be used together with the tungsten compound of the present invention, a well-known and generally used precursor used in a raw material for CVD can be used without any particular limitation.

Examples of other precursors include one, or two or more types of silicon or metal compounds selected from the group consisting of compounds including hydride, hydroxide, halide, azide, alkyl, alkenyl, cycloalkyl, aryl, alkynyl, amino, dialkylaminoalkyl, monoalkylamino, dialkylamino, diamine, di(silyl-alkyl)amino, di(alkyl-silyl)amino, disilylamino, alkoxy, alkoxyalkyl, hydrazide, phosphide, nitrile, dialkylaminoalkoxy, alkoxyalkyldialkylamino, siloxy, diketonato, cyclopentadienyl, silyl, pyrazolato, guanidinato, phosphoguanidinato, amidinato, phosphoamidinato, ketoiminato, diketiminato, carbonyl, and phosphoamidinato as ligands.

Here, examples of the type of a metal of the precursor include magnesium, calcium, strontium, barium, radium, scandium, yttrium, titanium, zirconium, hafnium, niobium, tantalum, chromium, molybdenum, tungsten, manganese, iron, osmium, cobalt, rhodium, iridium, nickel, palladium, platinum, copper, silver, gold, zinc, cadmium, aluminum, gallium, indium, germanium, tin, lead, antimony, bismuth, lanthanum, cerium, praseodymium, neodymium, promethium, samarium, europium, gadolinium, terbium, dysprosium, holmium, erbium, thulium, and ytterbium.

The other precursors are known in the related art and methods of producing the same are known. Regarding a production method example, for example, when an alcohol compound is used as an organic ligand, an inorganic salt of a metal or its hydrate described above is reacted with an alkali metal alkoxide of the alcohol compound, and thereby a precursor can be produced. Here, examples of an inorganic salt of a metal or its hydrate include metal halides and nitrates, and examples of alkali metal alkoxides include sodium alkoxide, lithium alkoxide, and potassium alkoxide.

In the case of a single source method, the other precursor is preferably a compound having a similar thermal and/or oxidative decomposition behavior to the tungsten compound of the present invention, and in the case of a cocktail source method, a compound which has a similar thermal and/or oxidative decomposition behavior and also does not cause deterioration due to a chemical reaction or the like during mixing is preferable.

In addition, the raw material for thin film formation of the present invention may contain, as necessary, a nucleophilic reagent for imparting stability to the tungsten compound of the present invention and other precursors. Examples of nucleophilic reagents include ethylene glycol ethers such as glyme, diglyme, triglyme, and tetraglyme; crown ethers such as 18-crown-6, dicyclohexyl-18-crown-6, 24-crown-8, dicyclohexyl-24-crown-8, and dibenzo-24-crown-8; polyamines such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines such as cyclam and cyclen; heterocyclic compounds such as pyridine, pyrrolidine, piperidine, morpholine, N-methyl pyrrolidine, N-methyl piperidine, N-methyl morpholine, tetrahydrofuran, tetrahydropyran, 1,4-dioxane, oxazole, thiazole, and oxathiolane; β-ketoesters such as methyl acetoacetate, ethyl acetoacetate, and 2-methoxyethyl acetoacetate; and β-diketones such as acetylacetone, 2,4-hexanedione, 2,4-heptanedione, 3,5-heptanedione, and dipivaloylmethane. The amount of such a nucleophilic reagent used is preferably in a range of 0.1 mol to 10 mol and more preferably in a range of 1 to 4 mol with respect to 1 mol of the total amount of the precursors.

In the raw material for thin film formation of the present invention, an impurity metal element content, an impurity halogen content such as impurity chlorine, and an impurity organic component other than the component constituting the same are minimized. The impurity metal element content is preferably 100 ppb or less and more preferably 10 ppb or less for each element, and the total amount thereof is preferably 1 ppm or less and more preferably 100 ppb or less. In particular, when used as a gate insulating film, a gate film, or a barrier layer of LSI, it is necessary to reduce the content of alkali metal elements and alkaline earth metal elements which affect electrical characteristics of the obtained thin film. The impurity halogen content is preferably 100 ppm or less, more preferably 10 ppm or less, and most preferably 1 ppm or less. The total amount of the impurity organic component is preferably 500 ppm or less, more preferably 50 ppm or less, and most preferably 10 ppm or less. In addition, since water causes generation of particles in the raw material for chemical vapor deposition and generation of particles in the thin film form, in order to reduce water in each of the metal compound, the organic solvent, and the nucleophilic reagent, it is preferable to remove water as much as possible during use. The content of water in each of the metal compound, the organic solvent, and the nucleophilic reagent is preferably 10 ppm or less and more preferably 1 ppm or less.

In addition, in the raw material for thin film formation of the present invention, in order to reduce or prevent particle contaminants in the formed thin film, it is preferable that as few as particles be contained. Specifically, in measurement of particles by a particle detector in a light scattering liquid in a liquid phase, the number of particles larger than 0.3 μm is preferably 100 or less in 1 ml of a liquid phase, the number of particles larger than 0.2 μm is more preferably 1000 or less in 1 ml of a liquid phase, and the number of particles larger than 0.2 μm is most preferably 100 or less in 1 ml of a liquid phase.

The method for producing a thin film of the present invention in which a thin film is produced using the raw material for thin film formation of the present invention is a CVD method in which vapor obtainable by vaporizing the raw material for thin film formation of the present invention and a reactive gas used as necessary are introduced into a film-forming chamber in which a substrate is set, and next, a precursor is decomposed and/or chemically reacted on the substrate and a metal-containing thin film grows and is deposited on the surface of the substrate. Regarding raw material transport supply methods, deposition methods, production conditions, production devices, and the like, well-known and generally used conditions and methods can be used without any particular limitation.

Examples of reactive gases used as necessary include oxygen, ozone, nitrogen dioxide, nitrogen monooxide, water vapor, hydrogen peroxide, formic acid, acetic acid, and acetic anhydride which have oxidizability and hydrogen which has reducibility. Examples of those for producing nitrides include organic amine compounds such as monoalkylamines, dialkylamine, trialkylamines, and alkylenediamines; hydrazine; and ammonia, and one, or two or more thereof can be used.

In addition, examples of transport supply methods include the gas transport method, liquid transport method, single source method, and cocktail source method described above.

In addition, examples of deposition methods include thermal CVD in which a thin film is deposited by reacting a raw material gas or a raw material gas and a reactive gas only by heating, plasma CVD using heat and plasma, photo CVD using heat and light, light plasma CVD using heat, light and plasma, and ALD in which a CVD deposition reaction is divided into elementary processes and stepwise deposition is performed at the molecular level.

Examples of materials of the substrate include silicon; ceramics such as silicon nitride, titanium nitride, tantalum nitride, titanium oxide, titanium nitride, ruthenium oxide, zirconium oxide, hafnium oxide, and lanthanum oxide; glass; and metals such as metal ruthenium. Examples of shapes of the substrate include a plate shape, a spherical shape, a fibrous shape, and a scaly shape. The surface of the substrate may be flat or may have a three-dimensional structure such as a trench structure.

In addition, the production conditions include a reaction temperature (substrate temperature), a reaction pressure, a deposition rate, and the like. The reaction temperature is preferably 100° C. or higher which is a temperature at which the tungsten compound of the present invention sufficiently reacts, and more preferably 150° C. to 500° C. The temperature is even more preferably 250° C. to 450° C. because the tungsten compound of the present invention has thermal stability at 300° C. or higher. In addition, the reaction pressure is preferably atmospheric pressure to 10 Pa in the case of thermal CVD or photo CVD, and is preferably 2000 Pa to 10 Pa when plasma is used.

In addition, the deposition rate can be controlled according to a raw material supply condition (vaporization temperature, vaporization pressure), a reaction temperature, and a reaction pressure. The deposition rate is preferably 0.01 to 100 nm/min and more preferably 1 to 50 nm/min because characteristics of the obtained thin film may deteriorate if the deposition rate is large and problems may occur in productivity if the deposition rate is small. In addition, in the ALD method, the number of cycles is controlled to obtain a desired film thickness.

The production conditions further include a temperature and pressure at which the raw material for thin film formation is vaporized into vapor. A process of vaporizing the raw material for thin film formation into vapor may be performed in the raw material container or in the vaporization chamber. In any case, the raw material for thin film formation of the present invention is preferably evaporated at 0° C. to 150° C. In addition, when the raw material for thin film formation is vaporized into vapor in the raw material container or the vaporization chamber, the pressure in the raw material container and the pressure in the vaporization chamber both are preferably 1 to 10000 Pa.

The method for producing a thin film of the present invention adopts the ALD method, and may include, in addition to a raw material introducing process in which a raw material for thin film formation is vaporized into vapor and the vapor is introduced into the film-forming chamber by the transport supply method, a precursor thin film forming process in which a precursor thin film is formed on the surface of the substrate using the tungsten compound in the vapor, an exhaust process in which an unreacted tungsten compound gas is exhausted, and a metal-containing thin film forming process in which the precursor thin film is chemically reacted with a reactive gas to form the metal-containing thin film on the surface of the substrate.

Hereinafter, the above processes will be described in detail using a case in which a metal oxide thin film is formed. When a metal oxide thin film is formed according to the ALD method, first, the raw material introducing process described above is performed. A preferable temperature and pressure when a raw material for thin film formation is vapored are the same as those described. Next, a precursor thin film is formed on the surface of the substrate using the tungsten compound introduced into the deposition reaction unit (precursor thin film forming process). In this case, the substrate may be heated or the deposition reaction unit may be heated to apply heat. The precursor thin film formed in this process is a metal oxide thin film or a thin film formed by decomposition and/or reaction of a part of the tungsten compound, and has a composition different from that of a desired metal oxide thin film. A substrate temperature when this process is performed is preferably room temperature to 500° C., and more preferably 200° C. to 500° C. The pressure of the system (in the film-forming chamber) in which this process is performed is preferably 1 to 10000 Pa and more preferably 10 to 1000 Pa.

Next, an unreacted tungsten compound gas and a byproduct gas are exhausted from the deposition reaction unit (exhaust process). An unreacted tungsten compound gas and a byproduct gas should ideally be completely exhausted from the deposition reaction unit, but they are not necessarily completely exhausted. Examples of an exhaust method include a method in which the inside of the system is purged with an inert gas such as nitrogen, helium, and argon, a method for exhausting by reducing the pressure in the system, and a combination method thereof. When the pressure is reduced, the degree of pressure reduction is preferably 0.01 to 300 Pa and more preferably 0.01 to 100 Pa.

Next, an oxidizing gas is introduced into the deposition reaction unit, and a metal oxide thin film is formed from the precursor thin film obtained in the previous precursor thin film forming process according to the action of the oxidizing gas or the action of the oxidizing gas and heat (metal oxide-containing thin film forming process). A temperature when heat is applied in this process is preferably room temperature to 500° C., and more preferably 150° C. to 350° C. The pressure in the system (in the film-forming chamber) in which this process is performed is preferably 1 to 10000 Pa and more preferably 10 to 1000 Pa. Since the tungsten compound of the present invention has favorable reactivity with an oxidizing gas, it is possible to obtain a metal oxide thin film. In addition, the tungsten compound of the present invention has favorable reactivity with a reducing gas such as ammonia and it is possible to obtain a metal tungsten thin film.

In the method for producing a thin film of the present invention, when the above ALD method is adopted, thin film deposition according to a series of operations including the above raw material introducing process, precursor thin film forming process, exhaust process, and metal-oxide-containing thin film forming process is set as one cycle, and this cycle may be repeated a plurality of times until a thin film with a required film thickness is obtained. In this case, after one cycle is performed, in the same manner as in the exhaust process, an unreacted tungsten compound gas and a reactive gas (an oxidizing gas when a metal oxide thin film is formed), and additionally, a byproduct gas are exhausted from the deposition reaction unit, and the next one cycle is then preferably performed.

In addition, in formation of a metal oxide thin film according to the ALD method, energy in the form of plasma, light, voltage and the like may be applied or a catalyst may be used. The time for which the energy is applied and the time for which a catalyst is used are not particularly limited, and the time may be, for example, during introducing a tungsten compound gas in the raw material introducing process, during heating in the precursor thin film forming process or in the metal-oxide-containing thin film forming process, during exhausting in the system in the exhaust process, or during introducing an oxidizing gas in the metal-oxide-containing thin film forming process, or may be between the processes.

In addition, in the method for producing a thin film of the present invention, after thin film deposition, in order to obtain more favorable electrical characteristics, an annealing treatment may be performed under an inert atmosphere, an oxidizing atmosphere, or reducing atmosphere, and a reflow process may be provided when step coverage is necessary. The temperature in this case is 200° C. to 1000° C. and preferably 250° C. to 500° C.

Regarding a device for producing a thin film using the raw material for thin film formation of the present invention, a well-known chemical vapor deposition device can be used. Specific examples of devices include a device that can perform bubbling supply of a precursor as shown in FIG. 1 and a device having a vaporization chamber as shown in FIG. 2. In addition, a device that can perform a plasma treatment on a reactive gas as shown in FIG. 3 and FIG. 4 may be exemplified. A device that can simultaneously process a plurality of wafers using a batch furnace can be used without limitation to a single-wafer type device as shown in FIG. 1 to FIG. 4.

A thin film produced using the raw material for thin film formation of the present invention can be made into a thin film of a desired type such as a metal, oxide ceramics, and nitride ceramics by appropriately selecting other precursors, reactive gases and production conditions. It is known that the thin film exhibits various electrical characteristics, optical characteristics, and the like, and is applied to various applications. It is used as, for example, a MOSFET gate electrode, a source/drain contact, or a memory word line used when an LSI is produced.

EXAMPLES

Hereinafter, the present invention will be described in more detail with reference to examples and evaluation examples. However, the present invention is not limited to the following examples and the like.

[Example 1] Production of Compound No. 1

7.80 g (0.019 mol) of methyl cyclopentadienyl tungsten tetrachloride and 72 ml of toluene were put into a 500 ml four-necked flask under an Ar atmosphere. While cooling in an ice bath, 16.8 g (0.193 mol) of tertiary amylamine was added dropwise thereto using a 100 ml dropping funnel and the mixture was then stirred at room temperature. The reaction solution was filtered, the solvent was evaporated under a slightly reduced pressure, and the filtrate was then distilled off under a reduced pressure, and thereby a 1.2 g yield of a black yellow liquid was obtained (yield 13%).

(Analysis Value)
(1)$^1$HNMR (solvent: heavy benzene) (chemical shift: multiplicity:H) (5.88 to 5.89:m:2) (5.61 to 5.62:m:2) (2.15:s:3) (1.46 to 1.61:m:4) (1.25:s:6) (1.18:s:6) (0.98:t:6)
(2) Elemental analysis (metal analysis: ICP-AES, chlorine analysis: TOX) W: 38.7 mass %, C: 41.3 mass %, H: 6.5 mass %, N: 6.0 mass %, Cl: 7.2 mass % (theoretical value: W: 39.2 mass %, C: 41.0 mass %, H: 6.2 mass %, N: 6.0 mass %, Cl: 7.6 mass %)
(3) Atmospheric pressure TG-DTA
Mass 50% reduction temperature: 227° C. (Ar flow rate: 100 ml/min, temperature increase 10° C./min)
(4) Reduced pressure TG-DTA
Mass 50% reduction temperature: 152° C. (10 Torr, Ar flow rate: 50 ml/min, temperature increase 10° C./min)

[Example 2] Production of Compound No. 4

31.2 g (0.072 mol) of isopropyl cyclopentadienyl tungsten tetrachloride and 287 ml of toluene were put into a 500 ml four-necked flask under an Ar atmosphere. While cooling in an ice bath, 69.8 g (0.801 mol) of tertiary amylamine was added dropwise thereto using a 100 ml dropping funnel, and the mixture was then stirred at room temperature. The reaction solution was filtered, the solvent was evaporated under a slightly reduced pressure, and the filtrate was then distilled off under a reduced pressure, and thereby 13.9 g yield of a black yellow liquid (91 Pa, peak temperature 137° C.) was obtained (yield 39%).

(Analysis Value)
(1)$^1$HNMR (solvent: heavy benzene) (chemical shift: multiplicity:H) (5.87 to 5.88:m:2) (5.80 to 5.81:m:2) (3.11:sept:1) (1.47 to 1.62:m:4) (1.26:s:6) (1.19:s:6) (1.17:d:6) (1.00:t:6)
(2) Elemental analysis (metal analysis: ICP-AES, chlorine analysis: TOX)
W: 37.2 mass %, C: 43.8 mass %, H: 6.4 mass %, N: 5.5 mass %, Cl: 7.5 mass % (theoretical value: W: 37.0 mass %, C: 43.5 mass %, H: 6.7 mass %, N: 5.7 mass %, Cl: 7.1 mass %)
(3) Atmospheric pressure TG-DTA
Mass 50% reduction temperature: 240° C. (Ar flow rate: 100 ml/min, temperature increase 10° C./min)
(4) Reduced pressure TG-DTA
Mass 50% reduction temperature: 162° C. (10 Torr, Ar flow rate: 50 ml/min, temperature increase 10° C./min)

[Example 3] Production of Compound No. 36

1.50 g (0.003 mol) of isopropyl cyclopentadienyl tungsten tetrachloride and 40 ml of toluene were put into a 50 ml two-necked flask under an Ar atmosphere. 2.52 g (0.034 mol) of tertiary butylamine was added dropwise thereto using a syringe and the mixture was then stirred at room temperature. The reaction solution was filtered, the solvent was evaporated under a slightly reduced pressure, and the filtrate was then distilled off under a reduced pressure, and thereby 0.18 g yield of a black yellow liquid was obtained (yield 11%).

(Analysis Value)
(1)$^1$HNMR (solvent: heavy benzene) (chemical shift: multiplicity:H) (1.16:d:6) (1.26:s:18) (3.08:sept:1) (5.81:t:2) (5.88:t:2)
(2) Elemental analysis (metal analysis: ICP-AES, chlorine analysis: TOX)
W: 43.2 mass %, C: 34.8 mass %, H: 7.0 mass %, N: 6.2 mass %, Cl: 8.0 mass % (theoretical value: W: 43.7 mass %, C: 34.3 mass %, H: 6.9 mass %,
N: 6.7 mass %, Cl: 8.4 mass %)

(3) Atmospheric pressure TG-DTA

Mass 50% reduction temperature: 227° C. (Ar flow rate: 100 ml/min, temperature increase 10° C./min)

(4) Reduced pressure TG-DTA

Mass 50% reduction temperature: 143° C. (10 Torr, Ar flow rate: 50 ml/min, temperature increase 10° C./min)

[Evaluation Example 1] Evaluation of Physical Properties of Tungsten Compound

The states of the tungsten compounds Nos. 1, 4 and 36 of the present invention and the following Comparative Compound 1 were visually observed at atmospheric pressure and 20° C. The results are shown in Table 1.

[Chemical Formula 10]

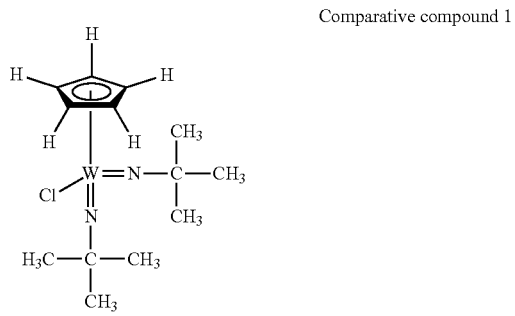

Comparative compound 1

TABLE 1

| Compound | State (20° C.) |
| --- | --- |
| Compound No. 1 | Liquid |
| Compound No. 4 | Liquid |
| Compound No. 36 | Liquid |
| Comparative Compound 1 | Solid |

Based on the results in Table 1, it was found that, while Comparative Compound 1 was a solid compound under conditions of 20° C., Compounds Nos. 1, 4 and 36 were a compound having a low melting point which was a liquid under conditions of 20° C. The compound having a low melting point was excellent because it could be stably and easily transported in a liquid state when used as a raw material for chemical vapor deposition.

[Example 4] Production of Tungsten Oxide Thin Film According to ALD Method

The tungsten compound No. 1 was used as a raw material for chemical vapor deposition, and according to the ALD method under the following conditions using an ALD device shown in FIG. 1, a tungsten oxide thin film was produced on a titanium nitride substrate. When the film thickness of the obtained thin film was measured according to an X-ray reflectance method, and the thin film structure and the thin film composition were checked through an X-ray diffraction method and X-ray photoelectron spectroscopy, the film thickness was 8 nm, and the film had a composition of tungsten oxide ($WO_3$). The carbon content and the chlorine content were smaller than 0.1 atom % which was a detection lower limit. The film thickness obtained in one cycle was 0.08 nm.

(Conditions)

Reaction temperature (substrate temperature): 350° C.

Reactive gas: ozone gas (Processes)

A series of processes including the following (1) to (4) was set as one cycle and repeated over 100 cycles:

(1) vapor of a raw material for chemical vapor deposition vaporized under conditions of a raw material container heating temperature of 100° C. was introduced and deposition was performed at a system pressure of 100 Pa for 10 seconds;

(2) purging with argon gas was performed for 30 seconds, and thereby unreacted raw material was removed;

(3) a reactive gas was introduced, and reacted at a system pressure of 100 Pa for 30 seconds; and (4) purging with argon gas was performed for 30 seconds, and thereby unreacted raw material was removed.

[Example 5] Production of Tungsten Oxide Thin Film According to ALD Method

A tungsten oxide thin film was produced on a titanium nitride substrate under the same conditions as in Example 4 except that the tungsten compound No. 4 was used as a raw material for chemical vapor deposition. When the film thickness of the obtained thin film was measured according to an X-ray reflectance method, and the thin film structure and the thin film composition were checked through the X-ray diffraction method and the X-ray photoelectron spectroscopy, the film thickness was 9 nm, and the film had a composition of tungsten oxide ($WO_3$). The carbon content and the chlorine content were smaller than 0.1 atom % which was a detection lower limit. The film thickness obtained in one cycle was 0.09 nm.

[Example 6] Production of Tungsten Oxide Thin Film According to ALD Method

A tungsten oxide thin film was produced on a titanium nitride substrate under the same conditions as in Example 4 except that the tungsten compound No. 36 was used as a raw material for chemical vapor deposition. When the film thickness of the obtained thin film was measured according to an X-ray reflectance method, and the thin film structure and the thin film composition were checked through the X-ray diffraction method and the X-ray photoelectron spectroscopy, the film thickness was 6 nm, and the film had a composition of tungsten oxide ($WO_3$). The carbon content and the chlorine content were smaller than 0.1 atom % which was a detection lower limit. The film thickness obtained in one cycle was 0.06 nm.

[Comparative Example 1] Production of Tungsten Oxide Thin Film According to ALD Method A tungsten oxide thin film was produced on a titanium nitride substrate under the same conditions as in Example 4 except that Comparative Compound 1 was used as a raw material for chemical vapor deposition. When the film thickness of the obtained thin film was measured according to an X-ray reflectance method, and the thin film structure and the thin film composition were checked through the X-ray diffraction method and the X-ray photoelectron spectroscopy, the film thickness was 3 nm, and the film had a composition of tungsten oxide ($WO_3$). The carbon content was 1 atom %, and the chlorine content was smaller than 0.1 atom % which was a detection lower limit. The film thickness obtained in one cycle was 0.03 nm.

Based on the results of Examples 4 to 6 and Comparative Example 1, it was found that, when tungsten compounds No. 1, 4 and 36 were used as a raw material for thin film formation, it was possible to produce a tungsten oxide thin film, and the film thickness of the tungsten oxide thin film obtained in one cycle which was two times or more as thick and the carbon impurity amount in the obtained film was 1/10 or less compared to the case when Comparative Compound 1 was used as a raw material for thin film formation. In particular, it was found that, when the tungsten compound No. 4 was used as a raw material for thin film formation, the film thickness obtained in one cycle was three times that when Comparative Compound 1 was used as a raw material for thin film formation, and it was possible to produce a tungsten oxide thin film with particularly high productivity.

Therefore, it was found that, when the tungsten compound of the present invention was used as a raw material for thin film formation to produce a tungsten oxide thin film, it was possible to produce a tungsten oxide thin film having high quality with high productivity.

The invention claimed is:

1. A tungsten compound comprising at least one selected from the group consisting of Compound No. 1 to No. 6, No. 9 to No. 14, No. 33 to No. 43, and No. 44:

Compound No. 1
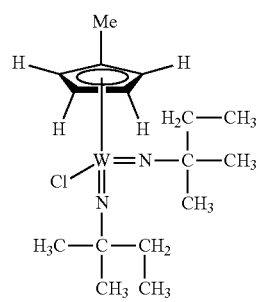

Compound No. 2
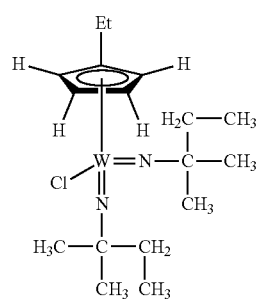

Compound No. 3
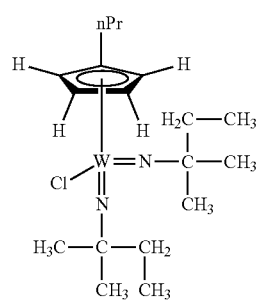

Compound No. 4
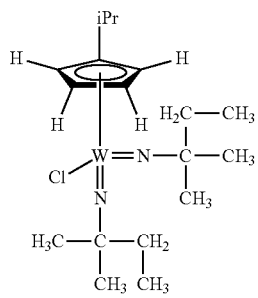

Compound No. 5
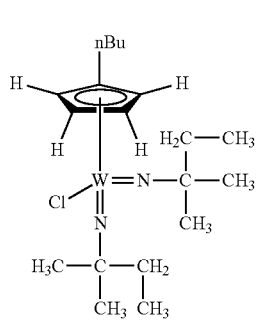

Compound No. 6
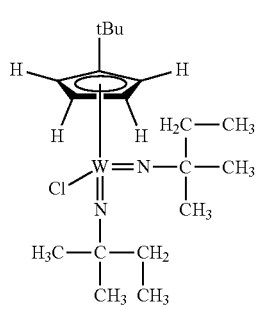

Compound No. 9
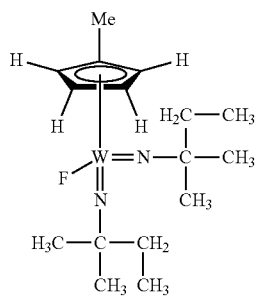

Compound No. 10
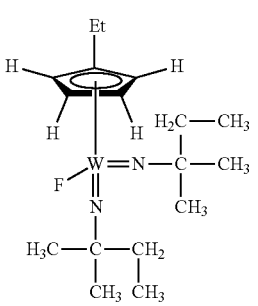

-continued
Compound No. 11
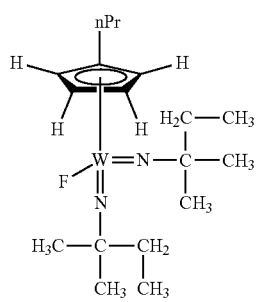
Compound No. 12
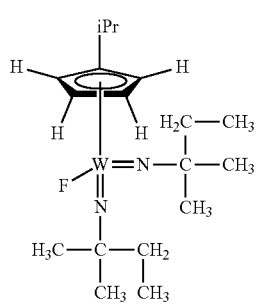
Compound No. 13
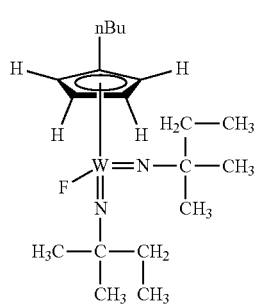
Compound No. 14
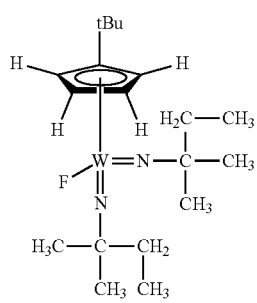
Compound No. 33
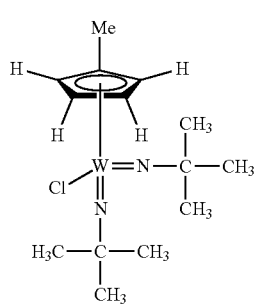
-continued
Compound No. 34
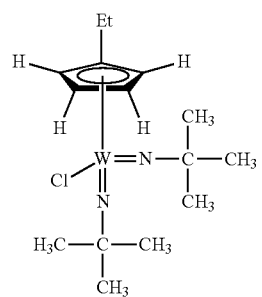
Compound No. 35
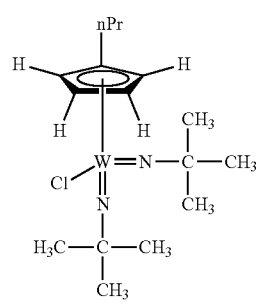
Compound No. 36
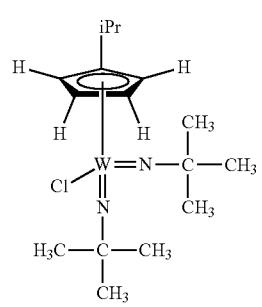
Compound No. 37
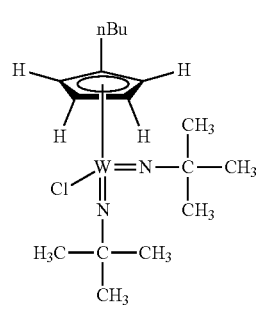
Compound No. 38
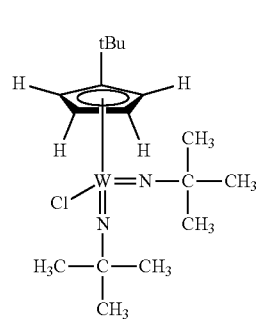

Compound No. 39

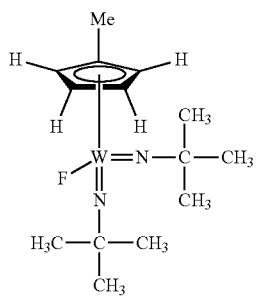

Compound No. 40

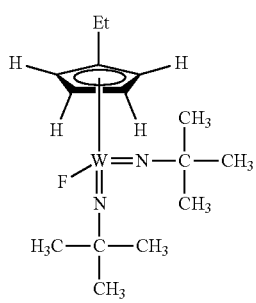

Compound No. 41

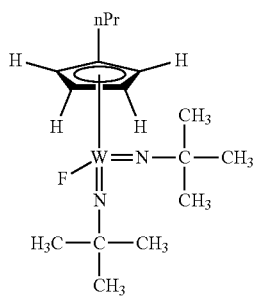

Compound No. 42

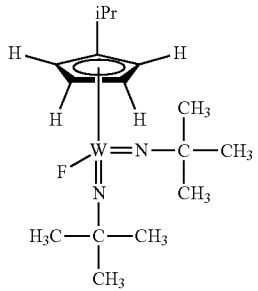

Compound No. 43

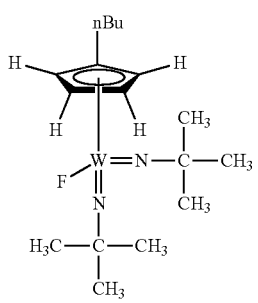

Compound No. 44

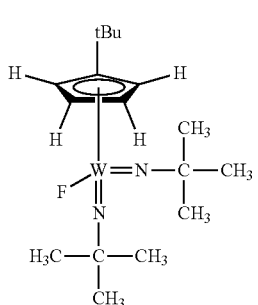

wherein Me represents a methyl group, Et represents an ethyl group, nPr represents an n-propyl group, iPr represents an isopropyl group, nBu represents an n-butyl group, and tBu represents a tert-butyl group.

2. A raw material for thin film formation comprising the tungsten compound according to claim 1.

* * * * *